(12) United States Patent
Miyamoto

(10) Patent No.: US 6,246,621 B1
(45) Date of Patent: Jun. 12, 2001

(54) SEMICONDUCTOR MEMORY DEVICE GENERATING ACCURATE INTERNAL REFERENCE VOLTAGE

(75) Inventor: Kenichi Miyamoto, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/490,278

(22) Filed: Jan. 24, 2000

(30) Foreign Application Priority Data

Apr. 23, 1999 (JP) .................................................. 11-116120

(51) Int. Cl.$^7$ ...................................................... G11C 7/02
(52) U.S. Cl. ................ 365/210; 365/230.06; 365/189.09
(58) Field of Search ..................................... 365/210, 200, 365/189.09, 227, 104, 230.06

(56) References Cited

U.S. PATENT DOCUMENTS 5,487,045 * 1/1996 Trodden ................................ 365/205
6,075,722 * 6/2000 Hibino ................................. 365/168
6,118,706 * 9/2000 Smayling et al. ............... 365/185.33

* cited by examiner

*Primary Examiner*—David Nelms
*Assistant Examiner*—Thong Le
(74) *Attorney, Agent, or Firm*—Jones Volentine, L.L.C.

(57) ABSTRACT

A semiconductor memory device has a memory cell array that outputs cell current to data sensing amplifiers and reference current to reference amplifiers. The reference amplifiers convert the reference current to a reference voltage. The data sensing amplifiers use the reference voltage to convert the cell current to a data voltage signal. According to a first aspect of the invention, reference current is supplied to a reference amplifier from two parallel data paths, each having approximately equal numbers of transistors of two types, one type of which is always switched on, the other type switching on and off. According to a second aspect of the invention, each data sensing amplifier, and the reference amplifier to which it is connected, receive currents from parts of the memory cell array having identical layouts.

5 Claims, 7 Drawing Sheets

SEMICONDUCTOR MEMORY DEVICE GENERATING ACCURATE INTERNAL REFERENCE VOLTAGE

BACKGROUND OF THE INVENTION

1. Field of the Invention

The present invention relates to a semiconductor memory device in which data values are sensed by current-to-voltage conversion, more particularly to the provision of a suitable reference current and reference voltage in this type of memory device.

2. Description of the Background Art

Current signals are used for data transport in, for example, non-volatile memory devices with single-transistor memory cells. When selected, the memory cells either conduct or block current, depending on the stored data value. Sensing circuits in the memory device convert the current flow to a data voltage signal Vs that has a high level or a low level, depending on the stored data value.

Such a memory device also has reference memory cells that always conduct current when selected. The sensing circuits convert a reference current received from the reference memory cells to a reference voltage signal Vref having a level intermediate between the high and low Vs levels. The difference between Vs and Vref is amplified to produce a '1' or '0' data output signal.

For quick and reliable amplification of the Vs-Vref difference, the reference voltage level Vref is preferably disposed halfway between the two Vs levels. In conventional memory devices, however, depending on the location of the memory cell being read, or on the data stored in other memory cells, the Vref level may be quite close to one of the two Vs levels. A resulting problem is that extra time must be allowed for amplification of the Vs-Vref difference, so the stored data cannot be accessed quickly. In the worst case, the wrong data value may be read.

Further explanation of this problem will be given in the detailed description of the invention.

SUMMARY OF THE INVENTION

A general object of the present invention is to shorten the read access time of a semiconductor memory device.

A more specific object is to provide a suitable reference current and reference voltage for use in reading data in a semiconductor memory device.

According to a first aspect of the invention, a semiconductor memory device has two types of transistors with different on-resistances. The transistors have control terminals coupled to a plurality of word lines. Transistors of the type with the higher on-resistance are switched on and off according to the word-line potential. Transistors of the other type remain switched on regardless of the word-line potential. The semiconductor memory device has at least one column of transistors of these types coupled in series, conducting a cell current when all switched on, each of the transistors constituting a memory cell.

The semiconductor memory device also has a reference amplifier receiving a reference current and generating a reference voltage, and a data sensing amplifier using the reference voltage to convert the cell current to a data voltage signal.

The reference current is supplied by a reference column having two parallel current paths joining at a common node, which is coupled to the reference amplifier. Each current path has substantially equal numbers of transistors of the above two types, coupled in series. Each word line is coupled to the control terminals of one transistor on each current path, these two transistors being of opposite type.

Reference current flows on one of the two parallel current paths at a time. A suitable reference current is obtained, because substantially equal numbers of transistors of the two types are present on the current path. A suitable reference voltage is therefore obtained.

According to a second aspect of the invention, a semiconductor memory device has a plurality of reference amplifiers converting respective reference currents to reference voltages, a plurality of data sensing amplifiers using the reference voltages to convert respective cell currents to data voltage signals, and a memory cell array supplying the reference currents and cell currents. At least two of the data sensing amplifiers receive cell currents from parts of the memory cell array having different layouts. Every interconnected data sensing amplifier and reference amplifier, however, receive a reference current and cell current from parts of the memory cell array having mutually identical layouts.

The identical layouts assure the supply of a suitable reference current to each reference amplifier and a suitable reference voltage to each data sensing amplifier.

DETAILED DESCRIPTION OF THE INVENTION

Figure 1:
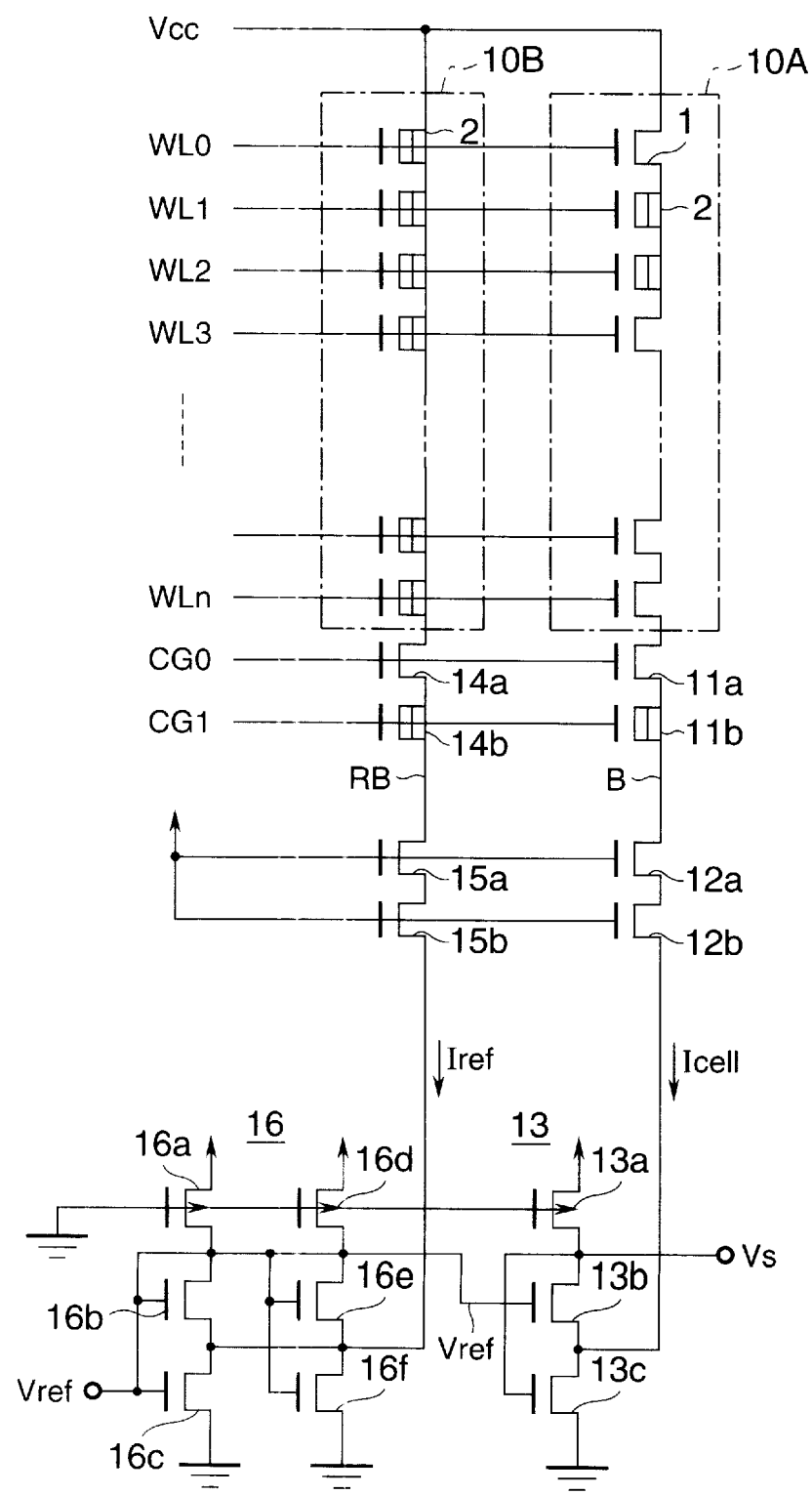
FIG. 1 is a circuit diagram illustrating a conventional semiconductor memory device with a NAND architecture.

Embodiments of the invention will be described with reference to the attached drawings, in which like parts are indicated by like reference characters. All of the embodiments are non-volatile semiconductor memory devices. Two conventional non-volatile semiconductor memory devices closely related to the embodiments will also be described.

Referring to FIG. 1, the first related conventional non-volatile semiconductor memory device comprises an array of field-effect transistors, some of which are enhancement-mode n-channel metal-oxide-semiconductor (NMOS) transistors 1, the remainder being depletion-mode n-channel metal-oxide-semiconductor (DMOS) transistors 2. The gate terminal (the control terminal) of each of these transistors 1, 2 is coupled to one of a plurality of word lines, designated WL0 to WLn. An NMOS transistor 1 conducts current when its gate terminal is at a positive voltage level referred to below as the high logic level or Vcc level, and blocks current when its gate terminal is at the low logic level or ground level. An NMOS transistor thus has a positive threshold voltage intermediate between the high and low logic levels. A DMOS transistor 2 has a negative threshold level, and conducts current both when its gate terminal is at the high logic level and when its gate terminal is at the low logic level.

The memory cell array includes a data-cell column 10A comprising a plurality of NMOS transistors 1 and/or DMOS transistors 2, which are coupled in series on a bit line B. Each transistor 1, 2 in this column 10A constitutes a memory cell. The value of the data stored in the cell depends on whether the transistor is a DMOS or an NMOS transistor. The array also includes an associated reference-cell column 10B comprising only DMOS transistors 2, which are coupled in series to a reference bit line RB. The bit line B and reference bit line RB both receive power at the Vcc voltage level from a power source such as an external terminal (not visible) of the semiconductor memory device.

The bit line B is coupled through further transistors 11a, 11b, 12a, 12b to a data sensing amplifier 13. The data sensing amplifier 13 comprises a p-channel metal-oxide-semiconductor (PMOS) transistor 13a and two NMOS transistors 13b, 13c. The source terminal of PMOS transistor 13a receives Vcc from the power source (indicated by an arrow). The drain terminals of PMOS transistor 13a and NMOS transistor 13b are mutually coupled to the gate terminal of NMOS transistor 13c, and to an output terminal for a data voltage signal Vs. The source terminal of NMOS transistor 13b and drain terminal of NMOS transistor 13c are mutually coupled to the bit line B. The source terminal of NMOS transistor 13c is coupled to ground. Transistors 13a, 13b, 13c are thus coupled in series between the power source and ground.

The reference bit line RB is coupled through transistors 14a, 14b, 15a, 15b to a reference amplifier 16. The reference amplifier 16 comprises a PMOS transistor 16a coupled in series with two NMOS transistors 16b, 16c between the power source and ground, and another PMOS transistor 16d coupled in series with two more NMOS transistor 16e, 16f between the power source and ground. The drain terminals of transistors 16a, 16b, 16d, 16e are mutually coupled to the gate terminals of transistors 16b, 16c, 16e, 16f, to the gate terminal of transistor 13b in the data sensing amplifier 13, and to an output terminal for a reference voltage Vref. The source terminals of NMOS transistors 16b, 16e and the drain terminals of NMOS transistors 16c, 16f are mutually coupled to the reference bit line RB.

The gate terminals of PMOS transistors 13a, 16a, 16d are grounded, so that these transistors are permanently switched on. The gate terminals of NMOS transistors 11a, 14a and DMOS transistors 11b, 14b receive respective gate control signals CG0, CG1 from a control circuit (not visible). The gate terminals of NMOS transistors 12a, 12b, 15a, 15b receive identical column selection signals from a column decoder (not visible).

This memory device is said to have a NAND architecture, because of the general resemblance of the data-cell column 10A to an NMOS NAND logic gate. For simplicity, FIG. 1 shows only a single data-cell column, but the memory device may also include other data-cell columns 10A and reference-cell columns 10B coupled to word lines WL0 to WLn, having respective data sensing amplifiers 13 and reference amplifiers 16.

Next, the reading of data from one of the memory cells in FIG. 1 will be described.

The word lines WL0 to WLn are normally held at the high logic level, so that all transistors 1, 2 in the data-cell column 10A and reference-cell column 10B are switched on. Read access starts when one of the word lines is driven to the low logic level, selecting the row of memory cells to which the word line is coupled. In addition, transistors 11a, 11b, 12a, 12b, 14a, 14b, 15a, 15b are switched on by the gate control signals CG0 and CG1 and column decoder.

Since DMOS transistors 2 conduct current regardless of the logic levels of the word lines, when transistors 14a, 14b, 15a, 15b are switched on, a reference current Iref flows from the all-DMOS reference-cell column 10B through the reference amplifier 16 to ground.

If the transistor in the selected row of the data-cell column 10A is a DMOS transistor 2, a similar data-cell current Icell flows to the data sensing amplifier 13, reaching ground through NMOS transistor 13c. If the selected transistor in the data-cell column 10A is an NMOS transistor 1, however, this transistor 1 switches off and the flow of data-cell current Icell is blocked.

When the data-cell current Icell is blocked, the data sensing amplifier 13 holds the data voltage signal Vs at a comparatively low level, near the threshold level of NMOS transistor 13c. When Icell current flows, the drain potential of NMOS transistor 13c and the source potential of NMOS transistor 13b rise, reducing the gate-source voltage and hence the conductivity of NMOS transistor 13b, thereby raising the data voltage signal Vs. As Icell increases, Vs continues to rise. The data sensing amplifier 13 thus functions as a transresistance amplifier, converting the received cell current Icell to a voltage Vs that increases as Icell increases.

The reference amplifier 16 operates in substantially the same way, generating a reference voltage Vref in response to the reference current Iref. Because the reference current is branched through two NMOS transistors 16c, 16f, however, for a given amount of reference current Iref, the reference voltage Vref is only about half as high as the data voltage level Vs produced by the same amount of data-cell current Icell.

Figure 2:
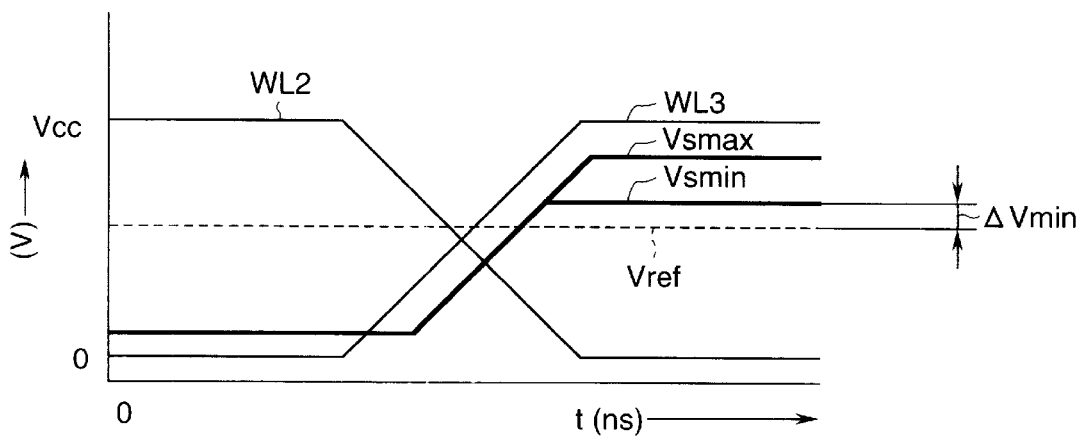
FIG. 2 is a waveform diagram illustrating the reading of data from the memory device in FIG. 1.

Because an NMOS transistor 1 has a higher on-resistance than a DMOS transistor 2, the data-cell current Icell varies, depending on the data stored in all the memory cells in the data-cell column 10A. FIG. 2 illustrates this effect when word line WL2, which is coupled to a DMOS transistor in data-cell column 10A, is selected after word line WL3, which is coupled to an NMOS transistor in data-cell column 10A. The vertical axis indicates voltage levels in volts, the high logic level corresponding to Vcc. The horizontal axis indicates time (t) in nanoseconds (ns). If the data-cell column 10A has a maximum number of DMOS transistors (if only the transistor coupled to word line WL3 is an NMOS transistor, for example), the data voltage signal Vs rises to a level Vsmax well above the reference level Vref. If the data-cell column 10A has the minimum number of DMOS transistors (if only the transistor coupled to word line WL2 is a DMOS transistor, for example), the increased on-resistance of the other (NMOS) transistors reduces the data-cell current, and the data voltage signal Vs rises to a level Vsmin only slightly above the reference level Vref.

To obtain output data, the difference between Vs and Vref is amplified to the Vcc level, by circuits not shown in the drawings. The small difference ΔVmin between Vsmin and Vref takes time to amplify, leading to the problem of slow data readout, and potentially leading to erroneous data.

Figure 3:
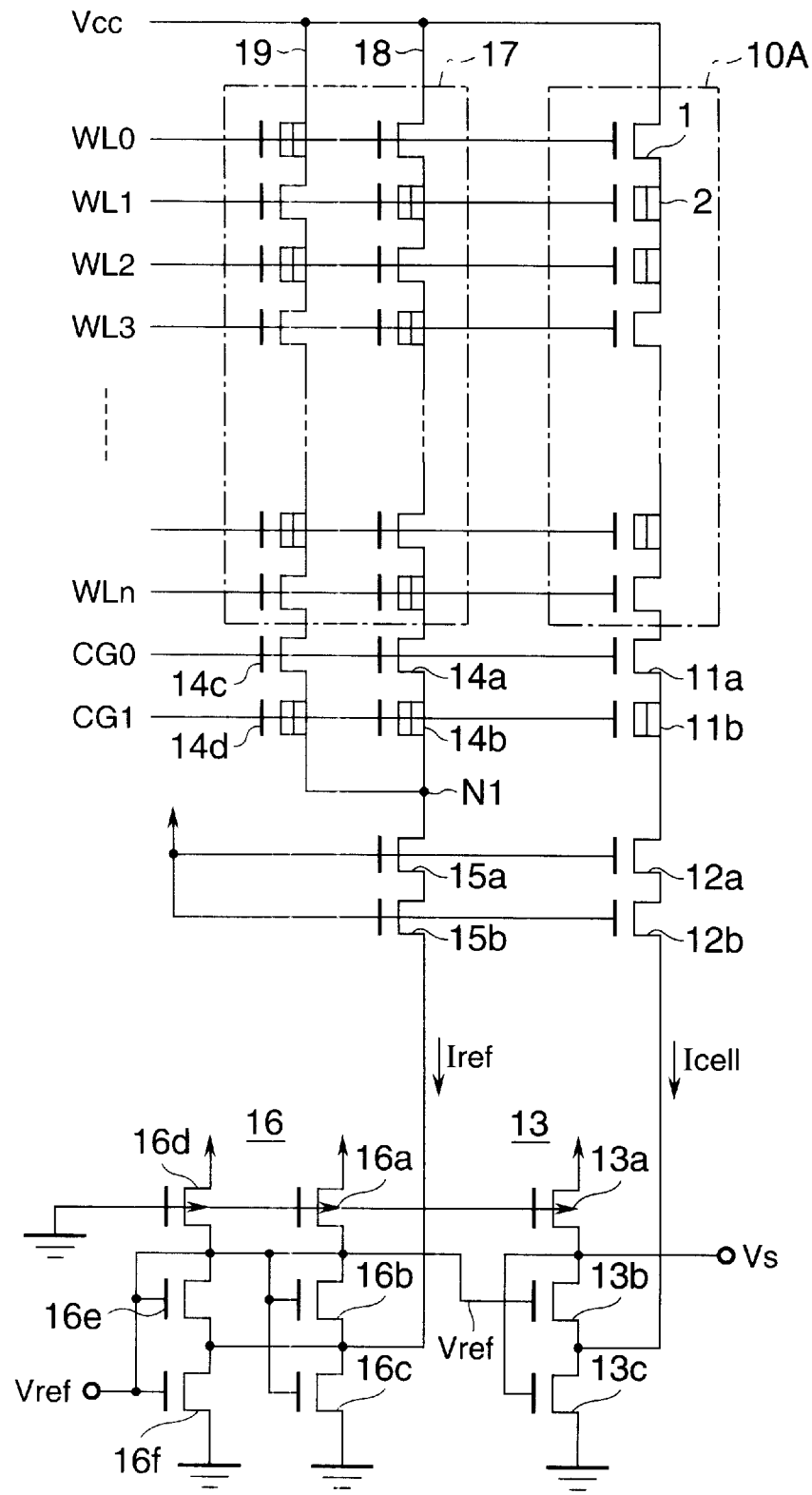
FIG. 3 is a circuit diagram of another semiconductor memory device with a NAND architecture, embodying the present invention.

As a first embodiment of the invention, FIG. 3 illustrates a memory device with a NAND architecture similar to that described above, except that the reference-cell column 17 has two parallel current paths 18, 19, both receiving Vcc from the power source (not visible). On the first current path 18, NMOS transistors 1 alternate with DMOS transistors 2 in a series starting with an NMOS transistor having its gate terminal coupled to word line WL0 and ending with a DMOS transistor having its gate terminal coupled to word line WLn. On the second current path 19, NMOS transistors 1 alternate with DMOS transistors 2 in a similar series, starting with a DMOS transistor having its gate terminal coupled to word line WL0 and ending with an NMOS transistor having its gate terminal coupled to word line WLn. Accordingly, half of the transistors on each current path 18, 19 are NMOS transistors, the other half are DMOS transistors, and each word line is coupled to the gate terminals of one NMOS transistor and one DMOS transistor in the reference-cell column 17.

The two current paths 18, 19 pass through separate pairs of gate-control transistors 14a, 14b, 14c, 14d. The two paths then merge at a node N1 and are coupled through a single pair of column selection transistors 15a, 15b to a reference amplifier 16, which has the same structure as in the conventional memory device described above. The data-cell column 10A, transistors 11a, 11b, 12a, 12b, and data sensing amplifier 13 are also the same as in the conventional memory device. Repeated descriptions of these circuit elements will be omitted.

Next, the reading of data from the memory device in FIG. 3 will be described.

All word lines WL0 to WLn are normally held at the high logic level, so that all transistors in the reference-cell column 17 are switched on. When read access begins, one of the word lines is driven to the low level, interrupting one of the two current paths 18, 19 in the reference-cell column 17. For example, if word line WL3 is driven low, the second current path 19 is interrupted, because the NMOS transistor coupled to word line WL3 on this current path is switched off. The other current path 18 is not interrupted, because the DMOS transistor on word line WL3 on this path 18 remains in the on-state.

Reference current Iref therefore flows on just one of the two current paths 18, 19 to the reference amplifier 16. Less reference current Iref flows than in the conventional memory device described above, because half of the transistors on the current path are NMOS transistors 1, which have a higher on-resistance than DMOS transistors 2. The resulting reference voltage Vref is accordingly lower than in the conventional memory device.

Figure 4:
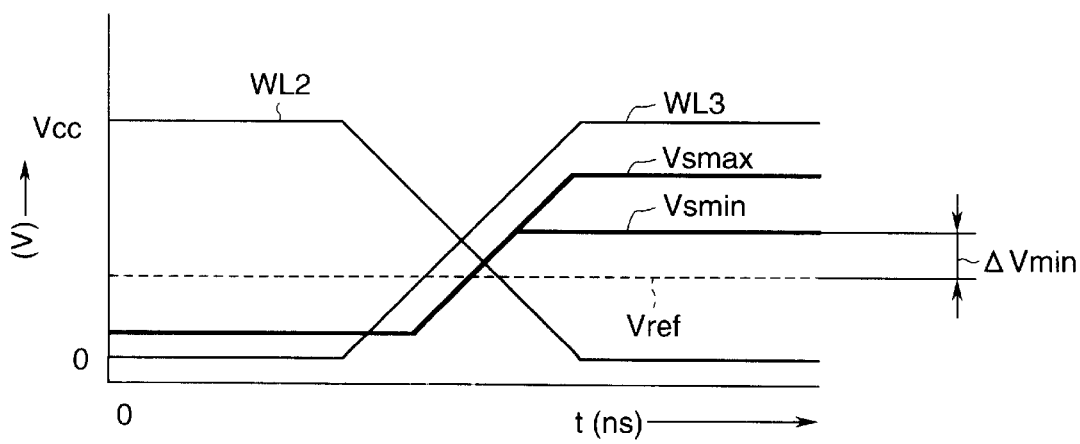
FIG. 4 is a waveform diagram illustrating the reading of data from the memory device in FIG. 3.

As in the conventional memory device, if the transistor on the selected word line in the data-cell column 10A is a DMOS transistor 2, data-cell current Icell flows into the data sensing amplifier 13, the size of the current depending on the total number of DMOS transistors 2 in the data-cell column 10A. FIG. 4 shows the resulting data voltage signal Vs waveforms, the horizontal and vertical axes representing time and voltage as in FIG. 2. The Vs waveforms in FIG. 4 are generally similar to the Vs waveforms in FIG. 2, rising to a comparatively high level Vsmax when the number of DMOS transistors 2 in the data-cell column 10A is maximal, and to a somewhat lower level Vsmin when the number of DMOS transistors is minimal. The reference voltage level Vref, however, is now considerably lower than both of these levels Vsmax and Vsmin. The Vref level is approximately one half of a level halfway between Vsmax and Vsmin.

Even in the minimal case, the difference ΔVmin between Vsmin and Vref is large enough to be amplified quickly and reliably, providing valid output data in a short time. The problems of slow read access and, in the worst case, unreliable data, which were present in the conventional memory device in FIG. 1, are accordingly solved.

A further advantage of the first embodiment is that the alternating layout of DMOS transistors and NMOS transistors in the reference-cell column 17 reduces the effect of mask alignment error and other factors that impair the uniformity of the semiconductor fabrication process, thereby improving the accuracy of the reference voltage and raising the yield of the fabrication process.

Figure 5:
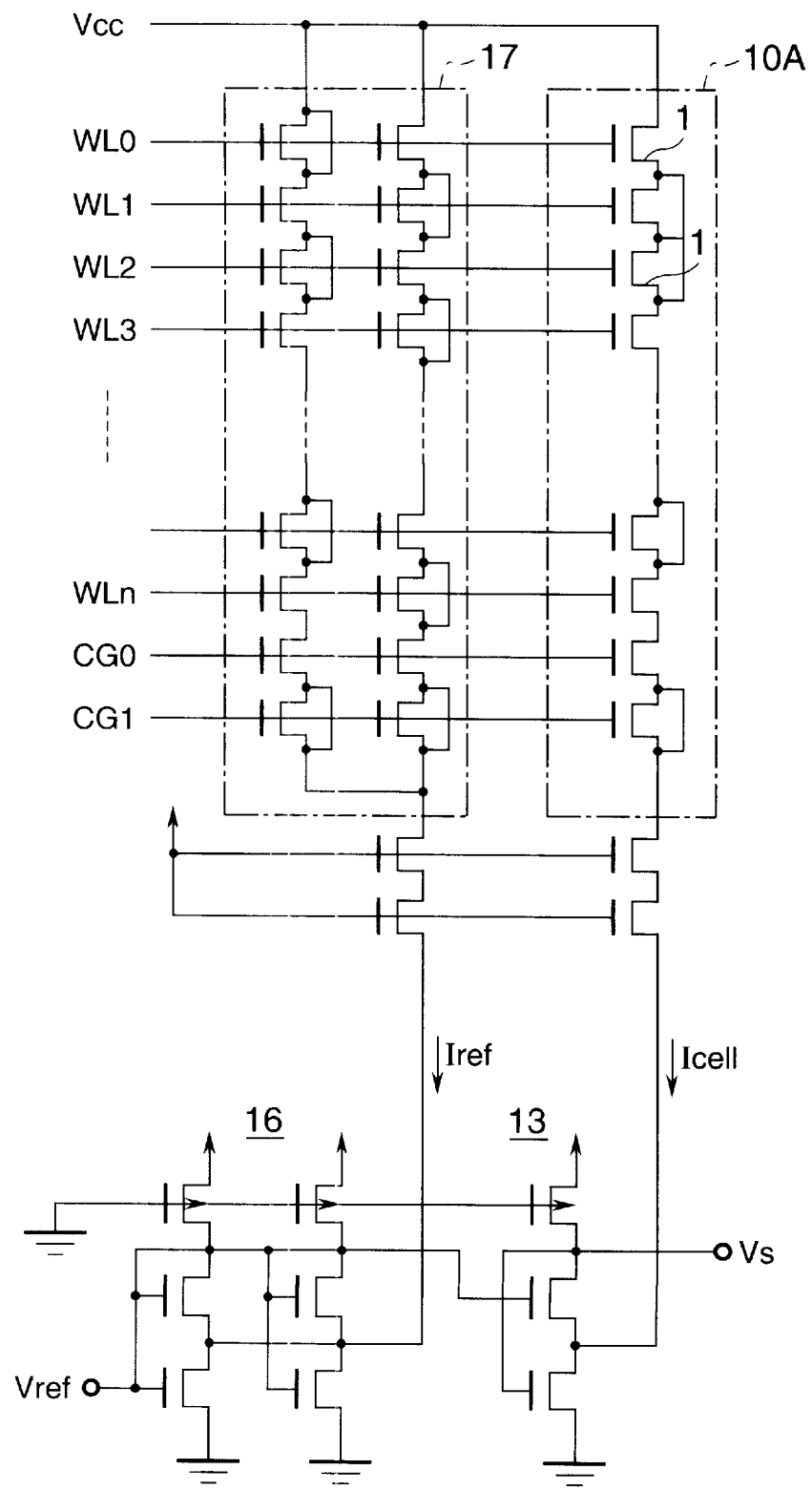
FIG. 5 is a circuit diagram illustrating a variation of the memory device in FIG. 3.

FIG. 5 shows a variation of the first embodiment in which all of the transistors in the data-cell column 10A and reference-cell column 17 are NMOS transistors 1. In the data-cell column 10A, the source and drain terminals of an NMOS transistor 1 are mutually short-circuited to store one data value, and are left in the normal condition (not short-circuited) to store the opposite data value. In the reference-cell column 17, NMOS transistors 1 having short-circuited source and drain terminals alternate with NMOS transistors that are not short-circuited in this way. The short-circuited NMOS transistors 1 are equivalent in function to the DMOS transistors in FIG. 3, conducting current regardless of the word-line logic level. The on-resistance of the short-circuited NMOS transistors 1 is also lower than the on-resistance of the NMOS transistors that are not short-circuited. The short circuits can be formed by metal interconnections or fuses, or by diffusion of impurities into the semiconductor substrate.

Figure 6:
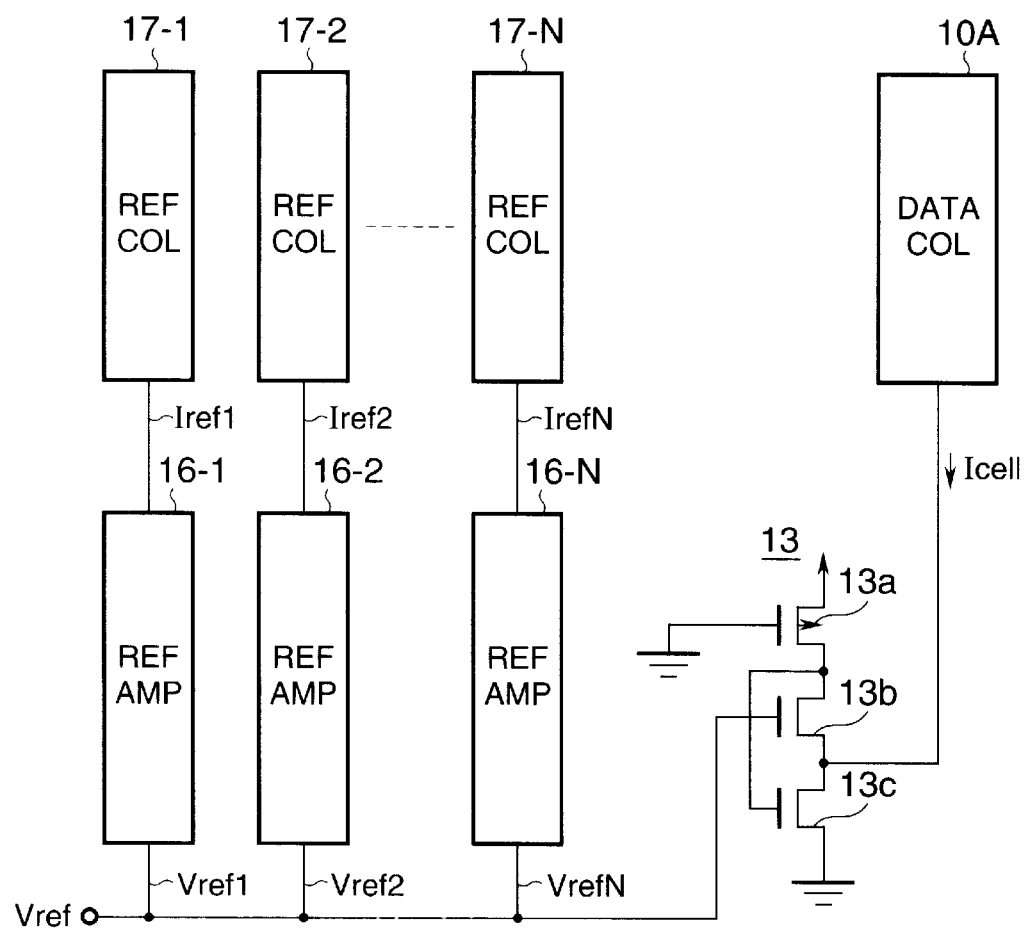
FIG. 6 is a circuit diagram of another semiconductor memory device with a NAND architecture embodying the present invention.

FIG. 6 illustrates a second embodiment of the invention, which also employs the NAND architecture. The data-cell column (DATA COL) 10A in the second embodiment has the same internal structure (not visible) as in the first embodiment, employing NMOS transistors to store one data value and DMOS transistors to store the opposite data value. The data sensing amplifier 13 also has the same structure as in the first embodiment.

In place of the single reference amplifier 16 and reference-cell column 17 of the first embodiment, the second embodiment has N reference amplifiers 16-1 to 16-N and N reference-cell columns (REF COL) 17-1 to 17-N, where N is an integer greater than one. Each of the reference amplifiers 16-1 to 16-N is identical to the reference amplifier 16 in the first embodiment. Each of the reference-cell columns 17-1 to 17-N is identical to the reference-cell column 17 in the first embodiment, having two parallel current paths. The i-th reference-cell column 17-i is coupled to the i-th reference amplifier 16-i (i=1, 2, . . . , N). The reference-cell columns 17-1 to 17-N generate respective reference currents Iref1 to IrefN. The reference amplifiers 16-1 to 16-N convert these reference currents to respective reference voltages Vref1 to VrefN.

The output terminals of the reference amplifiers 16-1 to 16-N are coupled in common to the gate terminal of NMOS transistor 13b in the data sensing amplifier 13, and to the reference voltage output terminal. The reference voltage Vref obtained at the reference voltage output terminal and supplied to the data sensing amplifier 13 is accordingly equal to the average of the N reference voltages Vref1 to VrefN.

The second embodiment operates in the same way as the first embodiment, and provides the same advantage of a reduced reference voltage, but is even more immune to the effects of variations in the semiconductor fabrication process, because such effects are averaged out by the averaging of the N reference voltages Vref1 to VrefN. A still more accurate reference voltage Vref is thus obtained.

Next, conventional and novel semiconductor memory devices having a NOR architecture will be described.

Figure 7:
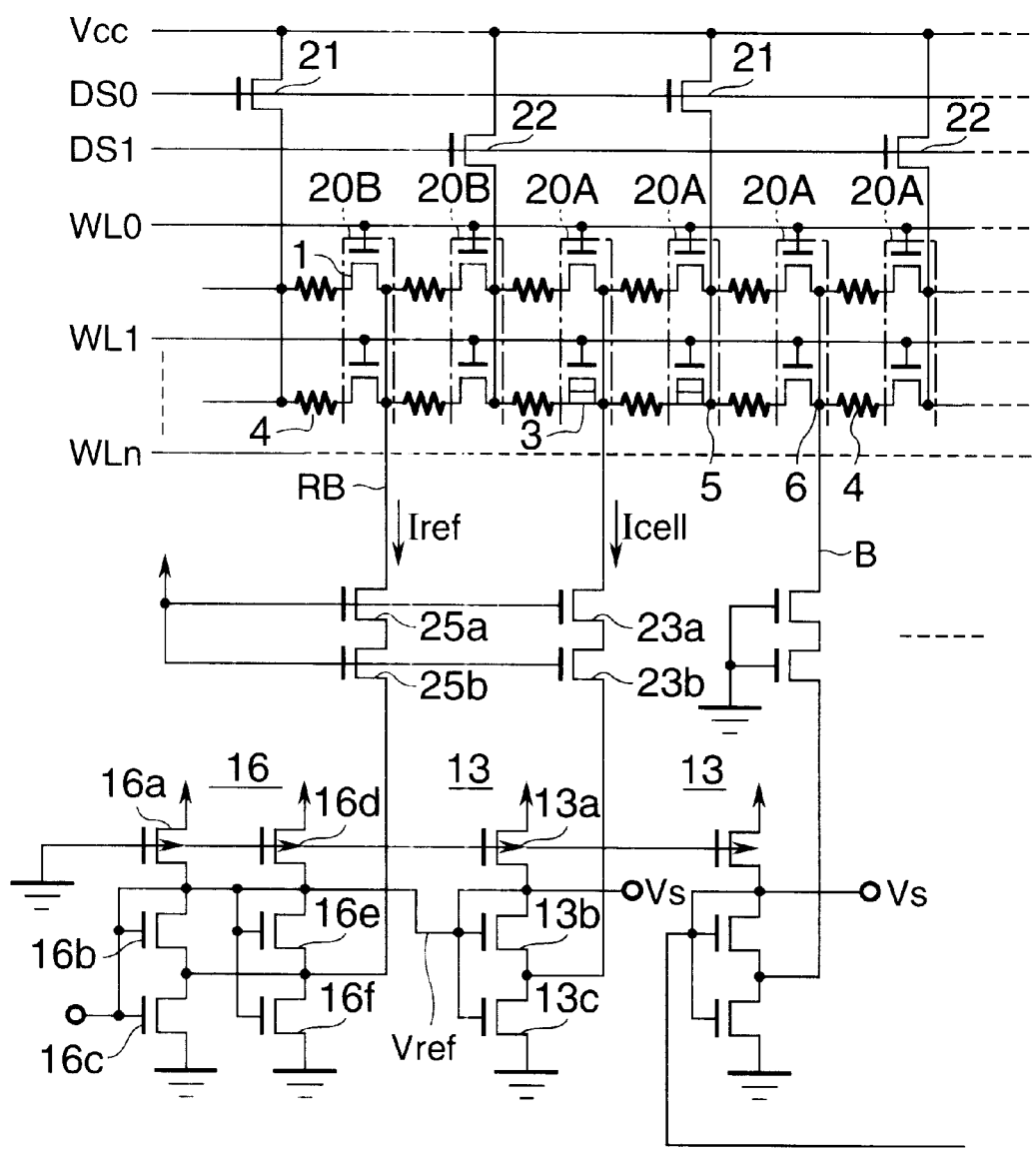
FIG. 7 is a circuit diagram illustrating a conventional semiconductor memory device with a NOR architecture.

Referring to FIG. 7, the conventional device comprises a memory-cell array with NMOS transistors 1 and enhanced-threshold enhancement-mode metal-oxide-semiconductor (EMOS) transistors 3, the gate terminals of which are coupled to word lines WL0, WL1, . . . The threshold voltage level of an EMOS transistor 3 is at least close to and preferably higher than the high logic level. Consequently, even when a word line is driven to the high logic level, the EMOS transistors 3 coupled to that word line remain switched off, or at least have a much higher on-resistance than the NMOS transistors 1 coupled to the same word line.

The memory cell array includes a plurality of data-cell columns 20A, each comprising a plurality of NMOS transistors 1 and/or EMOS transistors 3, each transistor 1, 3 constituting a data memory cell. The source terminal of each memory-cell transistor 1, 3 is coupled to a bit line B. Each bit line B is coupled in parallel to all of the transistors 1, 3 in two adjacent data-cell columns 20A.

The memory cell array also includes a plurality of reference-cell columns 20B, each having only NMOS transistors 1, the source terminals of which are coupled to a reference bit line RB. Each of these NMOS transistors 1 constitutes a reference memory cell. Each reference bit line RB is coupled in parallel to all of the transistors 1 in two adjacent reference-cell columns 20B.

The drain terminals of all of the transistors 1, 3 in the memory cell array are coupled in parallel through drain selection NMOS transistors 21, 22 to the power source (Vcc). The gate terminals of the drain selection transistors 21, 22 are coupled to a pair of drain selection signal lines DS0, DS1. The source terminal of each drain selection transistor 21, 22 is coupled to the drain terminals of two adjacent columns of transistors 1, 3 in the memory cell array. The array is laid out so that pairs of columns coupled to the drain selection transistors 21 controlled by data selection signal line DS0 alternate with pairs of columns coupled to the drain selection transistors 22 controlled by data selection signal line DS1.

The transistors 1, 3 coupled to each word line are also coupled in series in the horizontal or row direction in the drawing, their source and drain terminals being interconnected through resistors 4 at nodes 5, 6. In each horizontal row, nodes 5 coupled to Vcc through drain selection transistors 21, 22 alternate with nodes 6 coupled to amplifiers 13, 16 through NMOS transistors 23a, 23b, 25a, 25b. The resistors 4 are disposed between each node 5, 6 and the transistor 1, 3 to its right in the drawing, with one resistor 4 between each two adjacent transistors 1, 3. The resistors 4 are, for example, continuations of the source and drain diffusions of the transistors 1, 3.

Each bit line B is coupled through a pair of NMOS transistors 23a, 23b to a data sensing amplifier 13 of the type described in the first embodiment, comprising a PMOS transistor 13a and NMOS transistors 13b, 13c. Each reference bit line RB is coupled through a pair of NMOS transistors 25a, 25b to a reference amplifier 16 comprising PMOS transistors 16a, 16d, and NMOS transistors 16b, 16c, 16e, 16f, as described in the first embodiment. The gate terminals of NMOS transistors 23a, 23b, 25a, 25b are coupled to a column decoder (not visible). For simplicity, the decoder connections are shown as connections to the power source, indicating that the decoder signal is high, or to ground, indicating that the decoder signal is low.

Each bit line B is associated to a reference bit line RB, in that their NMOS transistors 23a, 23b, 25a, 25b receive the same signal from the column decoder, and the data sensing amplifier 13 coupled to the bit line B receives a reference voltage Vref from the reference amplifier 16 coupled to the reference bit line RB. For example, the bit line B in the center of FIG. 7 is associated to the reference bit line RB adjacent to its left.

The word lines WL0, WL1, . . . are normally held at the low logic level, so that all of the transistors 1, 3 in the memory cell array are switched off. The two drain selection signal lines DS0, DS1 are controlled in a complementary fashion, one being high when the other is low.

In a read access, one word line is driven to the high logic level, selecting the coupled row of transistors 1, 3. In columns selected by the column decoder, reference current Iref flows on the reference bit lines RB. In FIG. 7, if word line WL1 and drain selection signal line DS0 are driven high, most of the reference current Iref on the reference bit line RB follows a path leading through the nearest drain selection transistor 21 to the left, one resistor 4, and one NMOS transistor 1 in the reference-cell column 20B just to the left of reference bit line RB. If word line WL1 and drain selection signal line DS1 are driven high, most of the reference current Iref passes through the nearest data selection transistor 22 to the right, one NMOS transistor 1 in the reference-cell column 20B just to the right of reference bit line RB, and one resistor 4.

In FIG. 7, both of the transistors coupled to the bit line B associated to reference bit line RB happen to be EMOS transistors 3, so regardless of whether drain selection signal line DS0 or DS1 is driven high, the flow of data-cell current Icell is blocked, and the data sensing amplifier 13 coupled to this bit line B generates a data voltage signal Vs lower than the reference voltage level Vref supplied by the reference amplifier 16.

Similarly, since the transistors coupled to this bit line B and word line WL0 happen to be NMOS transistors 1, if word line WL1 is returned to the low state and word line WL0 is driven high, a data-cell current Icell substantially equal to the reference current Iref flows on the bit line B, and the data sensing amplifier 13 generates a data voltage signal Vs higher than the reference voltage Vref.

When a memory cell comprising an NMOS transistor 1 is read, since most of the data-cell current Icell passes through only the transistor 1 in the memory cell being read, the contents of other memory cells on the same bit line do not greatly affect the Icell current level or the resulting data voltage signal level Vs. The problem of a reduced Vs level that occurs in the conventional NAND architecture does not occur in the NOR architecture. The high Vs level may even be slightly raised by current following alternate paths through the memory cell array, passing through multiple NMOS transistors 1 and resistors 4.

When a memory cell comprising an EMOS transistor 3 is read, however, even if the threshold voltage of the EMOS transistor 3 is high enough to keep the EMOS transistor 3 switched off, the data-cell current Icell may not be completely blocked. Depending on the data stored in other nearby columns, a small amount of data-cell current Icell may flow through the above-mentioned alternate paths. The data-cell current Icell may also be incompletely blocked if the threshold level of the EMOS transistor 3 is not high enough to keep the EMOS transistor 3 fully switched off.

The low level of the data voltage signal Vs may therefore not be as low as in the NAND architecture.

Compounding this problem, variations in the semiconductor fabrication process may lead to variations in resistance values of the resistors 4. For example, an alignment difference between the nodes 5 coupled to Vcc and the nodes 6 coupled to the amplifiers 13, 16 may lead to a resistance difference depending on whether current flows into a given bit line B or reference bit line RB from the column to the left or the column the right. Similar current differences may also result from directional differences in the finishing of the interconnection patterns and from various other causes.

The overall result is that the reference voltage level Vref may not be disposed halfway between the high and low Vs levels, and there is a particular likelihood that the reference voltage level Vref will be too close to the low Vs level, causing a delay in obtaining amplified output data. For example, if the resistance is greater when a bit line or reference bit line is coupled to Vcc through the column on the left than when it is coupled to Vcc through the column on the right, then in FIG. 7, when drain selection signal line DS0 is driven high, the reference current Iref and reference voltage level Vref will be lowered, because reference bit line RB is coupled to Vcc through the column 20B to its left. At the same time, the data-cell current Icell on the associated bit line B is increased, because this bit line B is coupled to Vcc through the column 20A on the right. Both the high and low Vs levels are increased, with the result that the difference between Vref and the low Vs level is reduced, causing delays in reading data from memory cells with EMOS transistors 3, and possibly causing an incorrect data value to be read.

Figure 8:
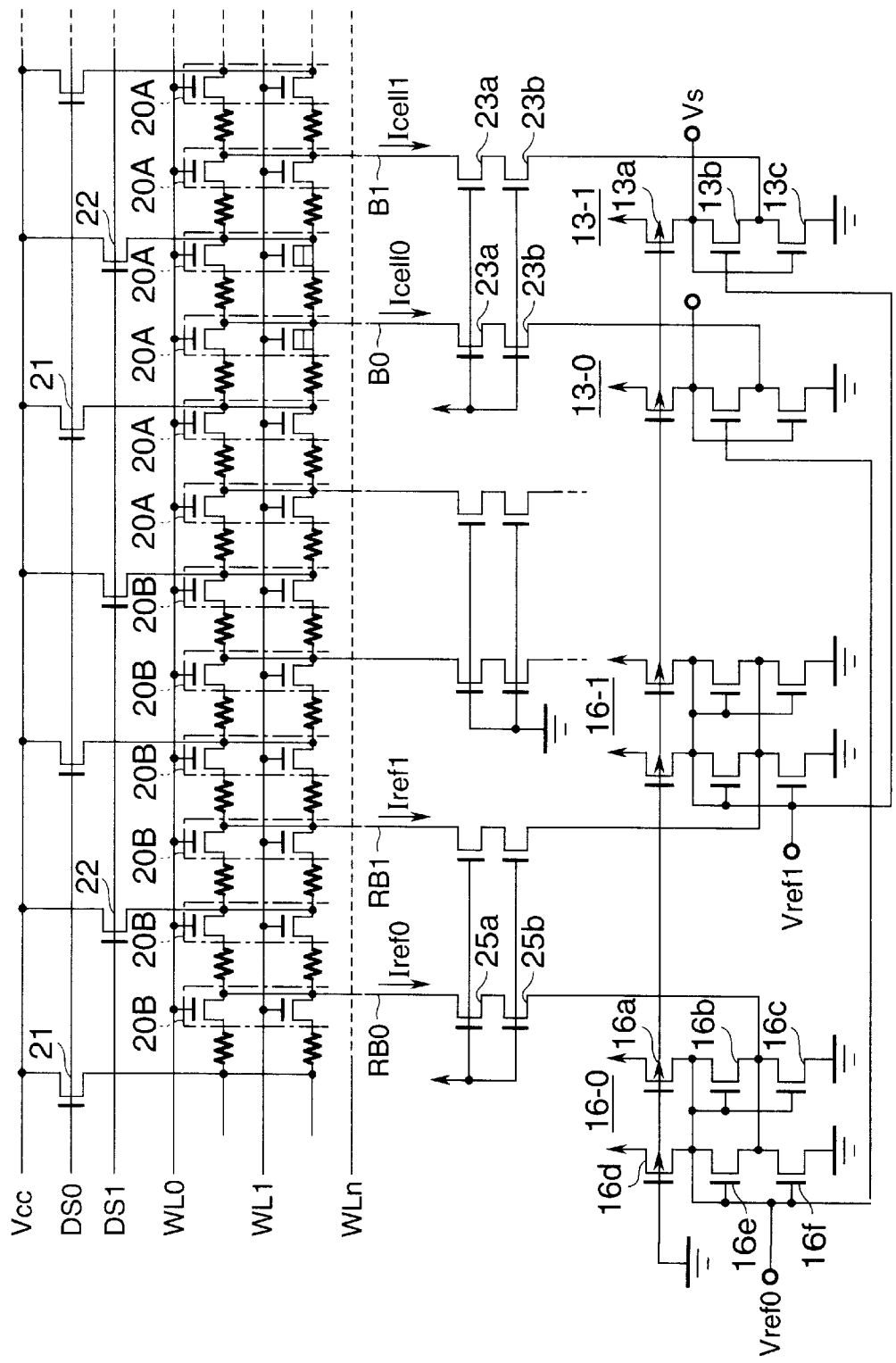
FIG. 8 is a circuit diagram of another semiconductor memory device with a NOR architecture, embodying the present invention.

As a third embodiment of the invention, FIG. 8 illustrates a memory device with a NOR architecture generally similar to that described above, but with different associations between bit lines and reference bit lines. The component elements of this embodiment are identical to the component elements with the same reference numerals in FIG. 7, so repeated descriptions will be omitted.

In FIG. 8, bit line B0 is associated to reference bit line RB0, and bit line B1 is associated to reference bit line RB1. The reference amplifier 16-0 coupled to reference bit line RB0 supplies a reference voltage Vref0 to the data sensing amplifier 13-0 coupled to bit line B0. The reference amplifier 16-1 coupled to reference bit line RB1 supplies a reference voltage Vref1 to the data sensing amplifier 13-1 coupled to bit line B1. The NMOS transistors 23a, 23b, 25a, 25b on both bit lines B0, B1 and reference bit lines RB0, RB1 are controlled by the same column decoder signal. For simplicity, two arrows are used in FIG. 8 to indicate that this column decoder signal is at the high logic level.

Bit line B0 and its associated reference bit line RB0 are disposed in positions with identical column layouts in the memory cell array. When drain selection signal line DS0 is driven high, both B0 and RB0 are coupled to Vcc through transistors in the adjacent column to the left. When drain selection signal line DS1 is driven high, both B0 and RB0 are coupled to Vcc through transistors in the adjacent column to the right. Any right-left differences in the resistance values of the resistors 4 accordingly affect both the data-cell current Icell0 and reference current Iref0 in the same way, and the reference voltage Vref0 remains approximately halfway between the high and low Vs levels.

Similarly, bit line B1 and its associated reference bit line RB1 are disposed in positions with identical column layouts, so any right-left resistance differences affect data-cell current Icell1 and reference current Iref1 in the same way, keeping reference voltage Vref1 approximately halfway between the high and low Vs levels derived from data-cell current Icell1.

Compared with the conventional device In FIG. 7, the third embodiment provides a greater operating margin with respect to fluctuations in EMOS transistor threshold levels, and to other factors that may cause variations in the data-cell current. Read access can accordingly be performed more quickly, with greater assurance of obtaining correct data. A greater operating margin with respect to variations in the power-supply voltage Vcc is also obtained.

In a variation of the third embodiment, each bit line is associated to two or more reference bit lines, as in the second embodiment, so that the reference voltage supplied to a data sensing amplifier 13 is the average of the reference voltages produced by a plurality of reference amplifiers 16. All reference bit lines associated with the same bit line have the same column layout as that bit line. Averaging improves the accuracy of the reference voltage, enabling accurate data value to be obtained even when the difference between the high and low Vs levels is not very large.

As described above, the present invention provides improved access speed and data reliability in semiconductor memory devices with both NAND and NOR architectures. Memory devices to which the invention can be applied include, for example, various types of read-only memories and flash memories.

In a flash memory, NMOS, DMOS, and EMOS transistors are created by storing different amounts of positive or negative charge in a floating gate.

The drawings show each reference amplifier 16 as supplying a reference voltage to only one data sensing amplifier 13, but this is not a restriction. A reference amplifier 16 may supply a reference voltage to multiple data sensing amplifiers 13; that is, a reference bit line may be associated with multiple bit lines.

In the first embodiment, the NMOS transistors 1 and DMOS transistors 2 do not necessarily have to be coupled in an alternating sequence on each current path 18, 19 in the reference-cell column 17. It is only necessary for each current path to have substantially equal numbers of NMOS transistors and DMOS transistors, and for each word line to be coupled to an NMOS transistor on one current path and a DMOS transistor on the other current path.

The third embodiment employs a particular NOR architecture in which each bit line, and each reference bit line, is coupled to two columns of cells, which are selected by drain selection transistors 21, 22, but the invention can be practiced in any architecture having bit lines and reference bit lines with at least two different circuit layouts, by associating each bit line to one or more reference bit lines with identical layouts.

The invention is not restricted to the NAND and NOR architectures. It can also be practiced in a memory device having an AND architecture, for example.

Those skilled in the art will recognize that further variations are possible within the scope claimed below.

What is claimed is:

1. A semiconductor memory device having transistors with respective control terminals, the transistors being of a first type and a second type, each transistor of the first type being switched on when its control terminal is at a first potential and off when its control terminal is at a second potential, each transistor of the second type being switched on when its control terminal is at the first potential and also when its control terminal is at the second potential, the transistors of the first type having a higher on-resistance than the transistors of the second type, comprising:

a plurality of word lines drivable to said first potential and said second potential;

at least one column of memory cells, each memory cell among said memory cells having a transistor of a type selected from among said first type and said second type, the control terminal of the transistor in the memory cell being coupled to one of said word lines, the transistors in said column of memory cells being mutually coupled in series and conducting a cell current when all switched on;

a reference amplifier receiving a reference current and converting the reference current to a reference voltage;

a data sensing amplifier coupled to said column of memory cells and said reference amplifier, using said reference voltage to convert said cell current to a data voltage signal; and a reference column having two parallel current paths joining at a common node from which said reference current is supplied to said reference amplifier, each of said two parallel current paths having a number of transistors of said first type coupled in series with a substantially equal number of transistors of said second type, each word line among said word lines being coupled to the control terminals of one transistor of said first type on one of said two parallel current paths and one transistor of the second type on another one of said two parallel current paths.

2. The semiconductor memory device of claim 1, wherein on each of said two parallel current paths the transistors of said first type are coupled in an alternating sequence with the transistors of said second type.

3. The semiconductor memory device of claim 1, wherein the transistors of said first type are n-channel metal-oxide-semiconductor field-effect transistors having a positive threshold voltage, and the transistors of the second type are n-channel metal-oxide-semiconductor field-effect transistors having a negative threshold voltage.

4. The semiconductor memory device of claim 1, wherein the transistors of said second type have short-circuited source and drain terminals.

5. The semiconductor memory device of claim 1, comprising more than one said reference column, and more than one said reference amplifier coupled to said data sensing amplifier, said data sensing amplifier receiving an average of the reference voltages supplied by all coupled reference amplifiers.

* * * * *